United States Patent [19]

Shel

[11] Patent Number: 5,585,766

[45] Date of Patent: Dec. 17, 1996

[54] ELECTRICALLY TUNED MATCHING NETWORKS USING ADJUSTABLE INDUCTANCE ELEMENTS

[75] Inventor: Viktor Shel, Milpitas, Calif.

[73] Assignee: Applied Materials, Inc., Santa Clara, Calif.

[21] Appl. No.: 330,167

[22] Filed: Oct. 27, 1994

[51] Int. Cl.[6] .............................. H03H 7/40; H01F 21/08
[52] U.S. Cl. ........................ 333/17.3; 334/12; 336/155
[58] Field of Search .............................. 333/17.3; 334/12, 334/71, 11, 13, 14; 336/155

[56] References Cited

U.S. PATENT DOCUMENTS

| | | | |
|---|---|---|---|
| 2,302,893 | 11/1942 | Roberts | 334/13 X |
| 2,611,030 | 9/1952 | Sontheimer | 333/17.1 |
| 2,884,632 | 4/1959 | Dewitz et al. | 343/850 |
| 2,996,682 | 8/1961 | Miller | 336/155 |
| 4,375,051 | 2/1983 | Theall | 333/17.3 |
| 4,450,716 | 5/1984 | Lefaucheux et al. | 73/146.5 |
| 4,518,941 | 5/1985 | Harada | 336/69 |
| 4,621,242 | 11/1986 | Theall, Jr. et al. | 333/17.3 |
| 4,904,972 | 2/1990 | Mori et al. | 336/55 |
| 4,951,009 | 8/1990 | Collins | 333/17.3 |
| 4,977,301 | 12/1990 | Maehara et al. | 219/715 |
| 5,065,118 | 11/1991 | Collins et al. | 333/33 |
| 5,079,507 | 1/1992 | Ishida et al. | 324/645 |
| 5,187,454 | 2/1993 | Collins et al. | 333/17.3 |

FOREIGN PATENT DOCUMENTS

| | | |
|---|---|---|
| 0597497 | 5/1994 | European Pat. Off. . |
| 1241227 | 8/1960 | France . |
| 901660 | 1/1954 | Germany . |
| 03174802 | 7/1991 | Japan . |
| 03174803 | 7/1991 | Japan . |
| 670680 | 4/1952 | United Kingdom . |
| WO-A-94-11891 | 5/1994 | WIPO . |

*Primary Examiner*—Paul Gensler
*Attorney, Agent, or Firm*—Fish & Richardson P.C.

[57] ABSTRACT

A plasma processing system for use in fabricating electronic devices including an RF generator; a process chamber including an electrical load which produces a plasma within the chamber when powered by the RF generator; an electronically tunable matching network connected between the RF generator and the electrical load of the process chamber, wherein during operation the matching network couples power from the RF generator into the plasma within the process chamber; and a control circuit connected to the matching network, wherein during operation the control circuit electronically adjusts the matching network so as to control a transfer of power from the RF generator into the plasma in the process chamber. The matching network includes an electronically tunable variable inductor including a core made of a material which exhibits a non-linear relationship between magnetic field intensity, H, and magnetic flux density, B. The core is configured as a closed loop defining a central opening. A magnetization coil is wound around the core so that the core forms a closed magnetic flux path for the magnetization coil. The magnetization coil includes two input terminals for coupling an electrical signal from the control circuit into the windings of the magnetization coil. There is also a primary coil formed around the outside of said closed-loop core and having input terminals for receiving a high-frequency current signal from the RF generator.

45 Claims, 5 Drawing Sheets

ELECTRICALLY TUNED MATCHING NETWORKS USING ADJUSTABLE INDUCTANCE ELEMENTS

BACKGROUND OF THE INVENTION

The invention relates to matching networks, such as are used in plasma processing systems, which use electronically adjustable inductance elements.

Plasma processing systems are typically used by the electronic device fabrication industry to produce devices such as flat panel displays, integrated circuits, memory chips, etc. In such plasma processing systems, power from a source (e.g. an RF generator) is coupled into a vacuum chamber that contains a particular gas, e.g. argon. Under the appropriate conditions, the power supplied to the chamber produces a plasma in the gas. The plasma is used to perform some phase of a fabrication process, e.g. sputtering a metal target to deposit a thin metal layer onto a substrate, etching material from the surface of the substrate to form device structures or metal pathways interconnecting the devices, reflowing a previously deposited metal layer, etc.

Figure 1:
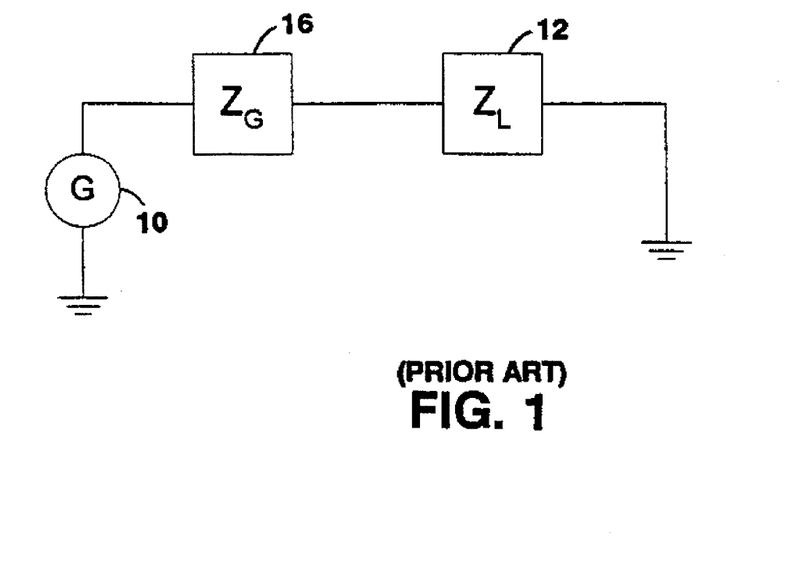
FIG. 1 is a block diagram showing a power generator supplying power to a load.

Typically, such plasma systems use some form of impedance matching to maximize the power transfer from the generator to the plasma in the chamber. To see how this is accomplished it is helpful to use a simplified model of the system, as shown in FIG. 1. In this simplified model, an alternating current (AC) generator 10, represented by an ideal current source 10 plus an output impedance of $Z_G$ (16), is connected to an electrical load 12 (i.e., the plasma in the chamber). One terminal of generator 10 and one terminal of load 12 are connected to ground. Maximum power transfer from the generator to the load 12 occurs when the output impedance $Z_G$ of the generator is the complex conjugate of the impedance $Z_L$ of load 12.

Figure 2:
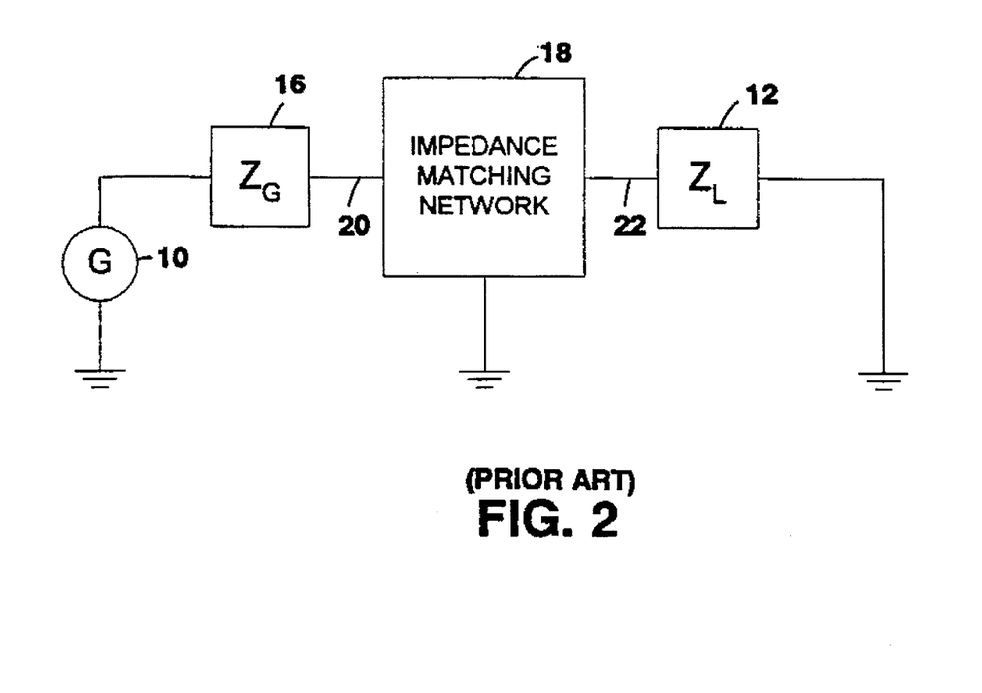
FIG. 2 is a block diagram of a power generator supplying power to a load through a matching network.

Usually, generator and load impedances do not match exactly, and an impedance matching network 18 must be installed between the generator and the load 12, as illustrated in FIG. 2. Often the generator impedance, which is indicated in FIG. 2 as having a value of $Z_G$, is purely resistive, for most practical purposes. The input impedance of the network 18 with the load connected, as seen looking into the network on input line 20, is $Z_{IN}$; and the output impedance of the network, with the generator connected, as seen looking back into the network on line 22, is $Z_{OUT}$. To maximize power transfer from generator 10 to load 12, $Z_{IN}$ is the complex conjugate of $Z_G$, and $Z_{OUT}$ is the complex conjugate of $Z_L$. The matching network contains one or more adjustable components, e.g. an adjustable inductor, which are tuned, either mechanically or electronically, to produce the $Z_{IN}$ and $Z_{OUT}$ which satisfy those conditions.

During a plasma process, the load $Z_L$ changes as the process conditions are altered or even as the process continues. Thus, to maintain a maximum transfer of power from the generator to the plasma, the matching circuit must also change its impedance to satisfy the new matching conditions. Since the changes in process conditions and in the characteristics of the plasma can be quite rapid, it is necessary to have a matching circuit that has a fast response time. For this it is useful to have electrically tunable elements within the matching circuit.

One example of a tunable inductor is described in U.S. Pat. No. 5,392,018, entitled "Electronically Tuned Matching Networks Using Adjustable Inductance Elements and Resonant Tank Circuits", by Ken Collins et al., incorporated herein by reference. The described inductor element shown in FIG. 3 includes a rod-shaped core 30 made of a ferromagnetic material, a primary coil 32 wound around the center region of the core, and two magnetization coils 34 and 36 on either end of the rod core, one on each side of the primary coil. Thus, each of the magnetization coils 34 and 36 has an axis which is collinear with the axis of the primary coil. By using the magnetization coils to vary the magnetic flux density through the core, one is able to modulate the inductance of primary coil. When used in a matching network that is intended for a plasma chamber, the inductor must be water cooled due to the large amount of heat that is generated in the inductor at the power levels that are typically required in such systems.

SUMMARY OF THE INVENTION

In general, in one aspect, the invention is a plasma processing system for use in fabricating electronic devices. The system includes an RF generator; a process chamber including an electrical load which produces a plasma within the chamber; an electronically tunable matching network for coupling power from the RF generator into the plasma within the process chamber; and a control circuit which electronically adjusts the matching network so as to control a transfer of power from the RF generator into the plasma in the process chamber. The matching network includes an electronically tunable variable inductor that has the following elements: a core made of a material which exhibits a non-linear relationship between magnetic field intensity, H, and magnetic flux density, B, said core configured as a closed loop defining a central opening; a magnetization coil wound around the core so as to pass through the central opening so that the core forms a closed magnetic flux path for the magnetization coil; and a primary coil formed around the outside of the closed-loop core. The primary coil has input terminals for receiving a high-frequency current signal from the RF generator.

In general, in yet another aspect, the invention is the above-described inductance element.

In preferred embodiments, the variable inductor further includes a second magnetization coil wound around the core so as to pass through said central opening so that the core forms a closed magnetic flux path for the second magnetization coil. Also, the first and second magnetization coils are assembled onto the closed-loop core so that their axes are substantially perpendicular to the axis of the primary coil. Alternatively, the first and second magnetization coils are assembled onto the closed-loop core so that their axes are substantially parallel to the primary axis of the primary coil. Further, the closed loop core is rectangularly shaped and has two long sections and two short sections and wherein the two long sections are joined at each end by a corresponding one of the two short sections. The two long sections of the rectangular core are parallel to each other and the two short sections are parallel to each other. The primary coil is formed around the two long sections. And the two magnetization coils are assembled onto either the pair of short sections or the pair of long sections. The core is made of a ferromagnetic material, e.g. a ferrite.

The inventive design of the variable inductor improves the distribution of the magnetic flux density along the inductor core. Because the magnetic flux generated by the magnetization coils remains largely within the closed-loop core much less magnetic field strength (intensity) is required to change core permeability and RF coil inductance. This reduces copper losses in the DC magnetization coil(s). For a given inductance and AC current, the RF coil placed over the entire core length creates less magnetic flux density swing and as a result less hysteresis losses in a core material. All of this reduces heat generation in the inductor as compared to earlier designs. This reduction in heat generation is sufficient to eliminate the need for water cooling when used in connection with controlling plasma processes.

In addition, since the smaller magnetization coils are oriented substantially perpendicular to the large RF coil, there is also less magnetic coupling between the coils than in a configuration in which the coils are coaxially arranged.

Other advantages and features will become apparent from the following description of the preferred embodiment and from the claims.

DESCRIPTION OF THE PREFERRED EMBODIMENTS

Figure 4:
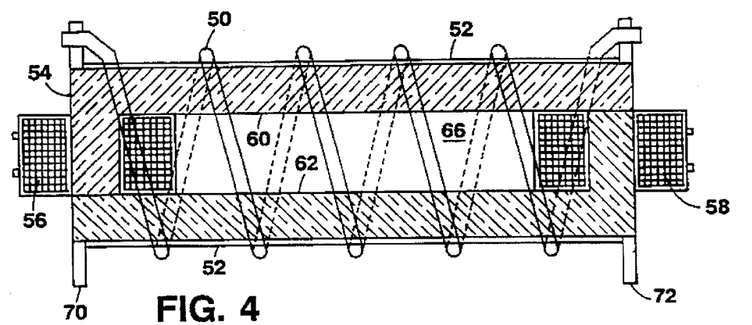
FIG. 4 shows a cross-sectional view of a variable inductor in accordance with the invention.

Referring to FIG. 4, an electronically adjustable inductor constructed in accordance with the invention includes an RF coil 50 wound around the outside of a cylindrical sleeve 52. A closed-loop, ferrite core 54 is located inside sleeve 52 and at opposite ends of coil 50, two magnetization coils 56 and 58 are wound around the closed-loop core and are oriented so that their axes are substantially perpendicular to the axis of RF coil 50 and their current polarities are selected to produce anti-parallel magnetic fields in the two opposed arms. The magnetic closed-loop core 54 passes through the inside each of magnetization coils 56 and 58 so as to provide a closed magnetic flux path for each coil that is inside of cylindrical sleeve 52 and does not encircle any part of RF coil 50. With this configuration, RF coil 50 can be placed over the core along its full length, as shown.

Figure 5:
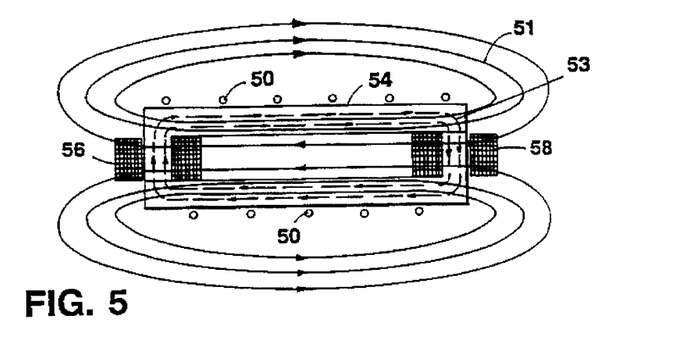
FIG. 5 shows the distribution of magnetic flux density with the variable inductor.

FIG. 5 illustrates the paths for the magnetic flux that are produced by RF coil 50 and by magnetization coils 56 and 58. RF coil 50 produces magnetic flux indicated by the lines labelled 51; whereas, magnetization coils 56 and 58 produce magnetic flux indicated by the lines labelled 53. The magnetic flux 53 produced by magnetization coils 56 and 58 remains within core 54. In contrast, the magnetic flux for RF coil 50 passes through core 54 on the inside of the sleeve 52 and closes on itself through the air on the outside of RF coil 50. Because of the perpendicular orientation of the magnetization coils with respect to the RF coil, the magnetic flux of RF coil 50 in the vicinity of the magnetization coils is parallel to the plane of the magnetization coils and thus, there is minimal coupling of the RF signal into the magnetization coils. In addition, if the magnetization coils are connected together (e.g. in series) and are arranged on the closed-loop core so as to each produce magnetic flux within the closed-loop core that is in the same direction around the closed-loop core (i.e., as shown), any minimal coupling of RF signal into the magnetization coils that might occur will tend to cancel. Furthermore, because the closed-loop core closes inside of sleeve 52 (i.e., the RF coil is commonly wrapped around the two opposed portions of the closed loop core and thus the closed loop core is inside of RF coil 5), the net magnetization flux seen by RF coil 50 is substantially zero. Thus, there is also minimal coupling of the magnetization coil signal into the RF coil.

Figures 3, 6:
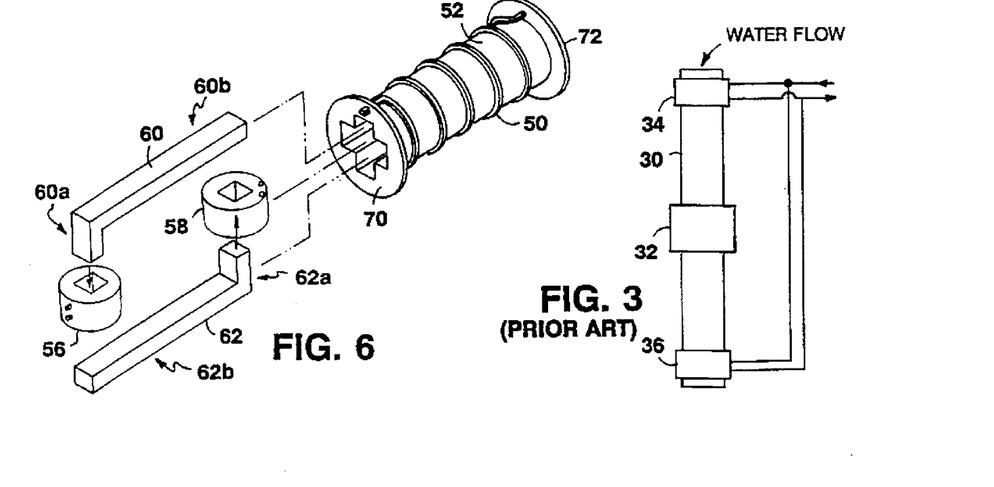
FIG. 3 shows a cross-sectional view of an earlier design of a variable inductor.
FIG. 6 shows an exploded view of the variable inductor of FIG. 4.

Core 54 is constructed from two identical L-shaped ferrite elements 60 and 62, each having a short arm 60a and 62a and a long arm 60b and 62b. When the two L-shaped elements 60 and 62 are placed together as illustrated in FIGS. 4 and 6, they form the closed magnetic flux path circuit around a rectangularly-shaped, central opening 66. Each of the two magnetization coils is assembled onto a corresponding one of short arms 60a and 62a of the L-shaped elements 60 and 62, respectively.

The two L-shaped elements 60 and 62 are held together by sleeve 52 into which they are inserted and by end pieces 70 and 72 on either end of sleeve 52, each of which has a cutout which conforms to and allows the insertion of the core with the magnetization coils into the sleeve. Because elements 60 and 62 are held together only by whatever physical force is exerted by sleeve 52 and end pieces 70 and 72, it is possible that a small gap may exist at the junctions of one L-shaped element with the other. To minimize the width of this gap, it is desirable to polish the abutting surfaces of the L-shaped elements so that they are flat and readily conform to each other.

In the described embodiment, coil 50 is made of solid copper wire and sleeve 52 is made of a rigid, non-magnetic, dielectric material (e.g. a plastic such as TEFLON™ or DELRIN™). Core 54 could be made of any ferromagnetic material or any material which has the property that its magnetic permeability is a function of magnetic flux density through the material. In other words, the material exhibits a non-linear relationship between magnetic field intensity, H, and magnetic flux density, B or, stated differently, the permeability of the core 54 as seen by the RF coil 50 is a function of the current through the magnetization coils 56 and 58. Such materials include soft ferrite and ceramic ferrite materials, steel and steel alloys. If it is necessary, however, to operate at high frequencies such as is typically the case in plasma processing systems (e.g. 400 kHz to 43.56 MHz), then some materials may be more appropriate than others. For example, the ferrite materials would be more appropriate than steel or the steel alloys. In the described embodiment, core 54 is made of a ferrite material, the permeability of which decreases as the magnetic flux through it increases.

The DC magnetization coils are of a conventional design. They may be either connected in series or in parallel. However, regardless of how they are connected, it is important that the magnetic fields which they produce reinforce each other within the core (i.e., are in the same direction with respect to the magnetic path of the core) rather than oppose each other. Moreover, it is also preferable that the current through each coil be the same (assuming that both coils have the same number of turns) so the magnetic fields that are generated by each coil have the same magnitude as well as the same direction.

The magnetization coils 60 and 62 are used to control the magnetic flux density within the core and to thereby modulate the permeability of the core as seen by RF coil 50. When no current is flowing through the magnetization coils, the inductance of the inductor (i.e., of RF coil 50) is at a maximum and has a value which is determined by the permeability of the core and the coil dimensions. When current is passed through magnetization coils, it produces a magnetic field within the core and that magnetic field reduces the permeability of the core. At some current level, the core will saturate and further increases in the current through the magnetization coils will not produce a further decrease in the permeability of the core. The inductance of the coil is minimum when the core is saturated. Thus, by slowly changing the DC current through the magnetization coils, one can control the total inductance seen on the RF coil 50.

By providing a magnetic path for the magnetization coils that remains entirely within the core, it becomes much easier to saturate the core. That is, the magnetization coil currents that are required to reach saturation are much lower as compared to designs in which the magnetic path includes a large air gap, such as the design shown in FIG. 3. This has the advantage that the inductor generates correspondingly lower losses and thus it produces much less heat than the prior designs.

The variable inductance element just described is used in a matching network for optimizing the transfer of power into a plasma chamber. Generally, the matching network may have any of a number of alternative topologies. Commonly used topologies are the "pi" topology shown in FIG. 7 and the "delta" topology shown in FIG. 8. The pi topology is used to deliver power to loads having a capacitive or inductive component, and the delta topology is used to deliver power to loads having only an inductive component. Thus, the one that is used depends upon the design of the plasma chamber with which the matching network is to be used.

Figure 7:
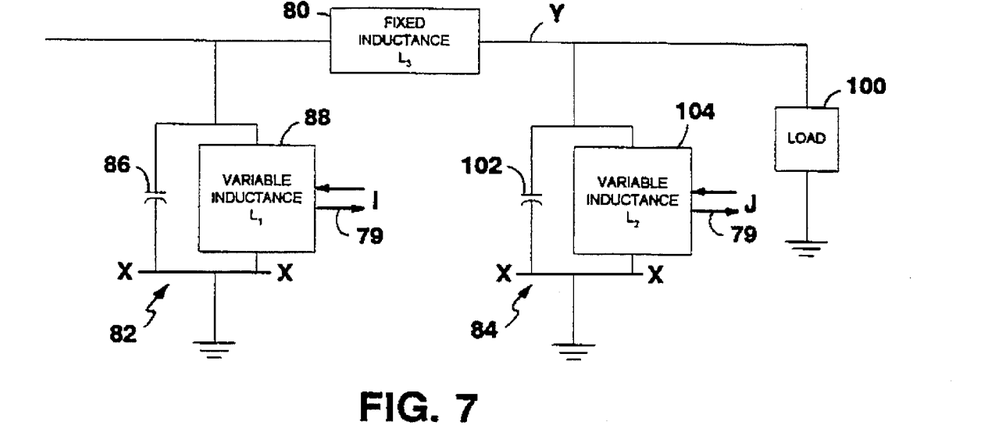
FIG. 7 is a block diagram of a matching network having a "pi" topology.

Referring to FIG. 7, the pi topology matching network includes a fixed series inductor 80 and two shunt circuits 82 and 84, one on each side of the fixed inductor. The first shunt circuit 82, which is in parallel with a generator or power source (not shown), is a parallel combination of a fixed capacitor 86 and a variable inductor 88. The other shunt circuit 84, which is in parallel with a load 100, is a parallel combination of a fixed capacitor 102 and a variable inductor 104. Each of the variable inductors 88 and 104 has control inputs 79 for input of DC control currents, indicated as I and J. The load 100 might include, for example, a bias electrode in a plasma chamber. A return path is provided through walls of the chamber, or through some other electrode, and the nature of the impedance will be predominantly capacitive, with a resistive power dissipating component.

Each of shunt circuits 82 and 84 is electrically equivalent to a variable capacitor. The variable inductor value is designed to provide an adjustment range of approximately 50–60 percent of the inductor's nominal value. For example, an inductor having a nominal inductance value of 10 µH (microhenries) might be made adjustable down to a value of approximately 4.5 µH.

The four X symbols in the diagram represent the locations of current transformers, by means of which current measurements are taken in each circuit branch in which an impedance is connected. Voltage is measured at the output of the network, as indicated at Y, and the network input voltage is already known from forward and reflected voltage measurements taken at the input. Specifically, the input voltage is the algebraic sum of the forward and reflected voltages. From these current and voltage measurements, the actual impedance values can be calculated for each of the impedances in the network. These calculated values are used by a control system (to be described later) in an iterative process to determine the settings of the control currents I and J that are required to achieve optimum transfer of energy from the generator into the load.

Figure 8:
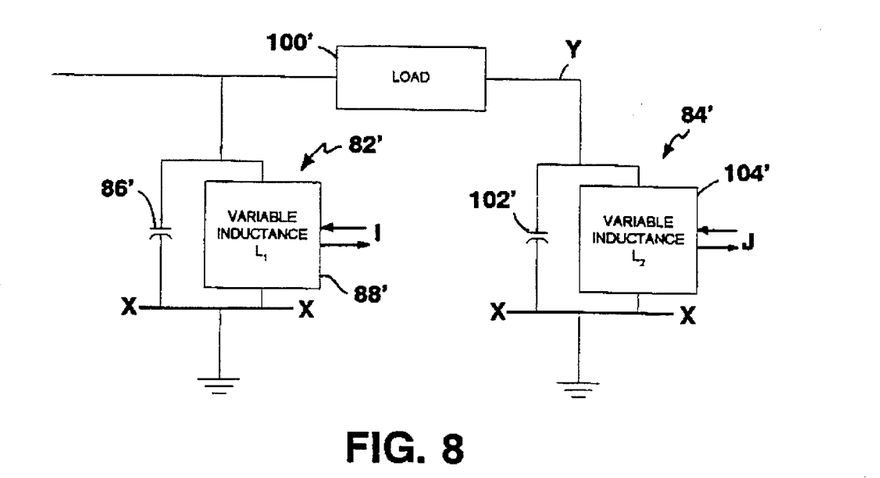
FIG. 8 is a block diagram of a matching network having a "delta" topology.

Referring to FIG. 8, the delta topology matching network differs from the pi topology in that the load 100' is predominantly inductive, with a resistive power dissipating component, and replaces the series-connected, fixed inductance 80 of the pi topology. The network includes two shunt circuits 82' and 84', each with fixed capacitors 86' and 102' and variable inductors 88' and 104', connected in the same manner as described for FIG. 7. As in FIG. 7, the symbols X and Y indicate locations at which measurements of current and voltage, respectively, are taken.

Figure 9:
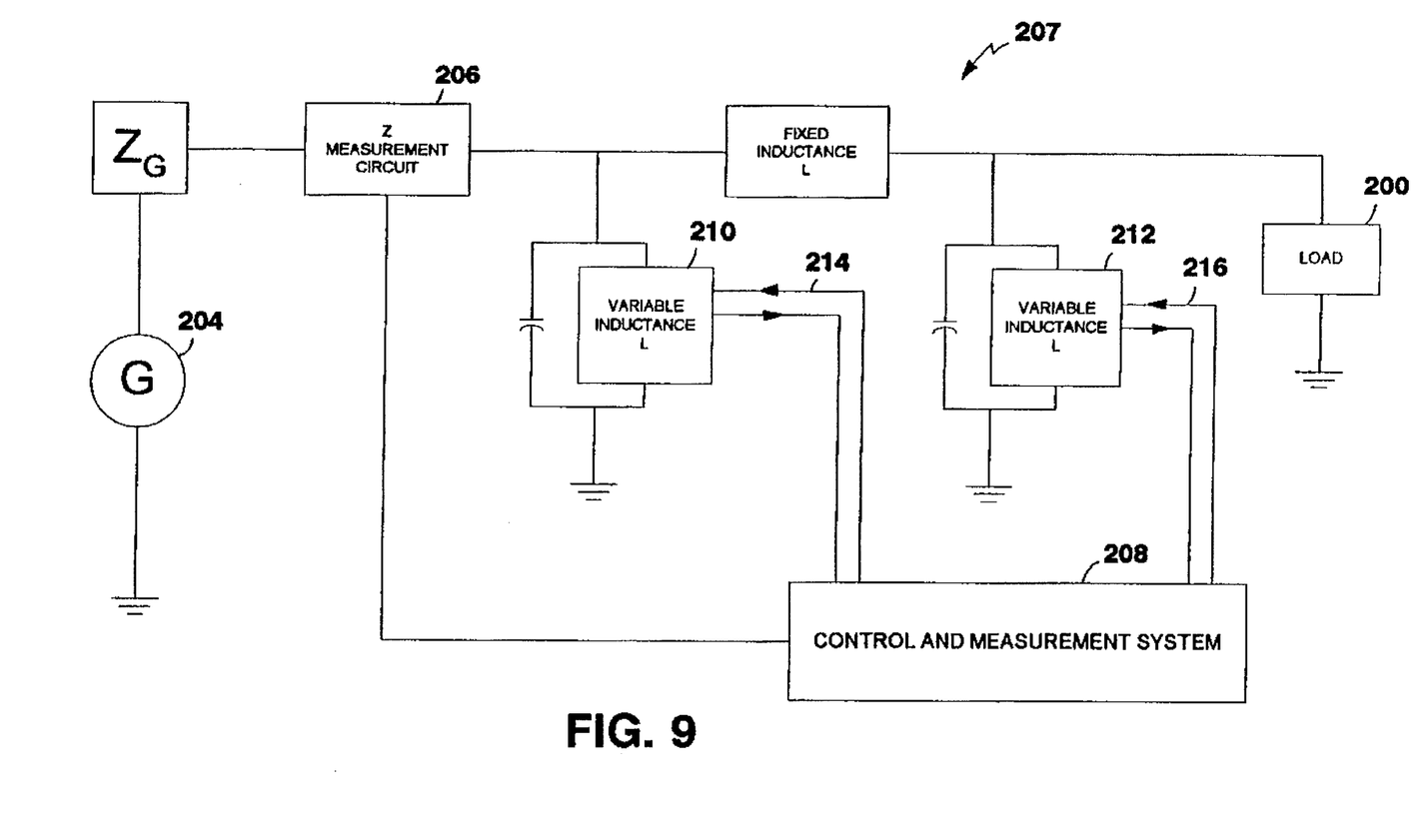
FIG. 9 is a block diagram of a matching network and a related control system for controlling the power to a plasma process.

Referring to FIG. 9, a plasma processing system which uses the previously described tunable inductor includes an RF element in a process chamber (identified as load 200), a matching network 202, an RF generator 204, a $Z_{IN}$ measurement circuit 206, and a control and measurement circuit 208 (also referred to as controller 208), which tunes the matching network to achieve the impedances required to maximize power transfer from the generator to the plasma in the chamber. In the described embodiment, the plasma processing system is a Centura HDP 5300 Oxide Etch Chamber which has been modified in accordance with the present invention. The Centura HDP 5300 is manufactured by Applied Materials, Inc. of Santa Clara, Calif. It uses a solid state, tunable matching RF network in which the tuning is accomplished by variable inductance inductors.

As indicated, the matching network includes two variable impedances 210 and 212 in which the impedance values may be selected by applying appropriate control signals 214 and 216, respectively. Controller 208 uses a mathematical model of the matching network to determine the optimum network values that will result in maximum transfer of power to the load. Controller 208 monitors actual impedance values in matching network 202 by measuring voltages and currents in the matching network. Based on these measurements and a new estimate of load impedance, controller 208 computes the amount of current that is necessary to change the inductance so as to match the chamber impedance.

A detailed description of the operation of the measurement and control circuit can be found in U.S. Pat. No. 5,187,454 to Collins, et al., incorporated herein by reference. Initially, when the system is first activated, the network parameters are initialized with preselected initial values. Then, the input impedance $Z_{IN}$ is measured by measurement circuit 206. This circuit may measure $Z_{IN}$ directly, or may measure some other quantity from which $Z_{IN}$ may be simply derived. The controller iteratively adjusts the variable network values so that they converge on a solution based on values that are repeatedly predicted by a mathematical model of the network. Briefly, and in general terms, the method that is implemented by measurement and control circuit 208 includes the steps of: (a) taking electrical measurements in the matching network to estimate the load impedance; (b) computing, using a model of the matching network, a set of optimum values for the variable impedances in the matching network which will produce an impedance match between the generator and the load if the estimated load impedance does not change; (c) adjusting the actual values in the matching network in a direction toward the optimum network values; and (d) repeating steps (a), (b) and (c) until the desired level of impedance matching is obtained.

The network values are controlled by output signals transmitted over signal lines to variable elements in the matching network. In the described embodiment, the inductance is controlled by varying the DC current in the magnetization coils of the tunable inductors.

Figure 10:
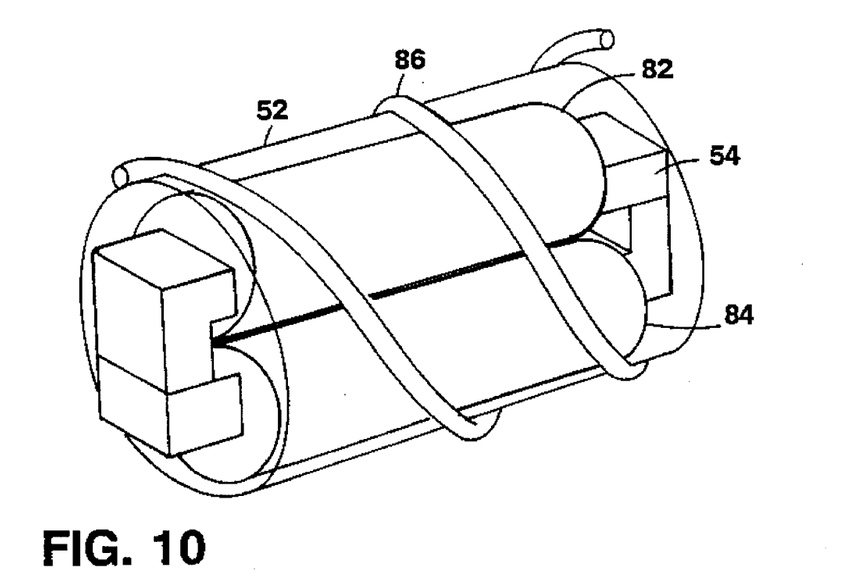
FIG. 10 shows an alternative embodiment of the variable inductor.

Other embodiments are within the following claims. For example, in an alternative embodiment shown in FIG. 10, DC magnetization coils 82 and 84 are placed over the long arms 60b and 62b of core 54 (rather than around the short arms 60a and 62a, as previously described) so that they are within RF coil 86 and have their axes parallel to the axis of RF coil 86. In this embodiment, both the closed-loop core and the two magnetization coils are surrounded by the sleeve 52 around which the RF coil 86 is wound.

Figure 11:
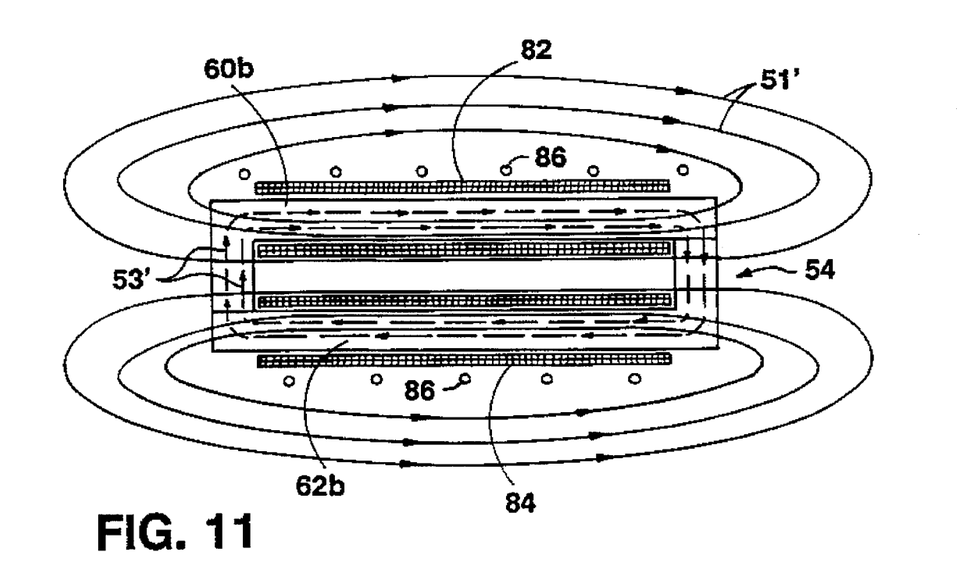
FIG. 11 shows the distribution of magnetic flux density with the alternative embodiment of the variable inductor.

As shown in FIG. 11, RF coil 86 produces magnetic flux indicated by the lines labelled 51' and magnetization coils 82 and 84 produce magnetic flux indicated by the lines labelled 53'. In this embodiment, the RF signal couples more strongly into the magnetization coils. However, if the magnetization coils are connected together (e.g. in series) and if they are oriented so as to produce magnetic flux within the closed-loop core that is in the same direction, the signals produced by the coupling will cancel.

What is claimed is:

1. A plasma processing system for use in fabricating electronic devices, said system comprising:
   an RF generator;
   a process chamber including an electrical load which produces a plasma within the chamber when powered by the RF generator;
   an electronically tunable matching network connected between the RF generator and the electrical load of the process chamber, wherein during operation said matching network couples power from the RF generator into the plasma within the process chamber; and
   a control circuit connected to the matching network and generating a control signal, wherein during operation said control circuit via the control signal electronically adjusts the matching network so as to control a transfer of power from the RF generator into the plasma in the process chamber,
   said matching network including an electronically tunable variable inductor comprising:
   a core made of a material which exhibits a non-linear relationship between magnetic field intensity, H, and magnetic flux density, B, said core configured as a closed loop defining a central opening;
   a magnetization coil on said core, said magnetization coil wound around said core so as to pass through said central opening whereby said core forms a closed magnetic flux path for said magnetization coil, said magnetization coil including two input terminals for coupling the control signal from the control circuit into the windings of said magnetization coil; and
   a primary coil formed around said closed-loop core in such a way that the primary coil exhibits a variable inductance the value of which is controlled by the control signal changing the magnetic permeability of the closed-loop core, said primary coil comprising one or more loops, each of which is arranged about said core so that said magnetization coil produces a net magnitization flux through each of said one or more loops that is substantially zero, said primary coil having input terminals receiving a high-frequency current signal from the RF generator.

2. The plasma processing system of claim 1 wherein the variable inductor further comprises a second magnetization coil wound around said core so as to pass through said central opening whereby said core forms a closed magnetic flux path for said second magnetization coil, said second magnetization coil including two input terminals for coupling the control signal from the control circuit into the windings of said second magnetization coil.

3. The plasma processing system of claim 2 wherein the primary coil is formed around said closed-loop core without having any portion thereof passing through said central opening.

4. The plasma processing system of claim 3 wherein the first mentioned magnetization coil has a first axis, the second magnetization coil has a second axis, and the primary coil has a primary axis and wherein the first and second magnetization coils are assembled onto the closed-loop core so that the first and second axes are substantially perpendicular to the primary axis of the primary coil thereby minimizing magnetic coupling between the magnetization coils and the primary coil.

5. The plasma processing system of claim 3 wherein the first mentioned magnetization coil has a first axis, the second magnetization coil has a second axis, and the primary coil has a primary axis and wherein the first and second magnetization coils are assembled onto the closed-loop core so that the first and second axes are substantially parallel to the primary axis of the primary coil.

6. The plasma processing system of claim 2 wherein the closed loop core is rectangularly shaped and has two long sections and two short sections and wherein the two long sections are joined at each end by a corresponding one of the two short sections, wherein the two long sections of said core are parallel to each other and the two short sections of said core are parallel to each other, and wherein the primary coil is formed around said two long sections.

7. The plasma processing system of claim 6 wherein each of the two magnetization coils is wound around a corresponding different one of the two short sections of said core.

8. The plasma processing system of claim 7 wherein the variable inductor further comprises a hollow, cylindrically-shaped sleeve around which the primary coil is wound, and wherein said closed loop core is located within said sleeve.

9. The inductance element of claim 8 wherein said hollow, cylindrically-shaped sleeve has a first opening at one end and a second opening at the other end and wherein the first-mentioned magnetization coil is within said first opening and said second magnetization coil is within said second opening.

10. The plasma processing system of claim 6 wherein each of the two magnetization coils is wound around a corresponding different one of the two long sections of said core.

11. The plasma processing system of claim 10 wherein the variable inductor further comprises a hollow, cylindrically-shaped sleeve around which the primary coil is wound, and wherein said closed loop core is located within said sleeve.

12. The plasma processing system of claim 10 wherein the two magnetization coils are connected in parallel.

13. The plasma processing system of claim 10 wherein the two magnetization coils are connected in series.

14. The plasma processing system of claim 10 wherein the two magnetization coils are connected so as to generate cooperating magnetic fields within said closed-loop core.

15. The plasma processing system of claim 1 wherein the RF generator produces RF power at frequencies above about 400 kHz.

16. The plasma processing system of claim 10 wherein said core is made of a ferromagnetic material.

17. The plasma processing system of claim 16 wherein said core is made of a ferrite material.

18. The plasma processing system of claim 1 wherein the closed loop of said core lies parallel to a core plane and wherein the primary coil is wound about a primary axis that is substantially parallel to the core plane.

19. An inductance element for generating an electrically tunable inductive reactance to a high-frequency current signal, said inductance element comprising:

a core made of a material which exhibits a non-linear relationship between magnetic field intensity, H, and magnetic flux density, B, said core configured as a closed loop defining a central opening;

a first magnetization coil on said core, said magnetization coil wound around said core so as to pass through said central opening whereby said core forms a closed magnetic flux path for said magnetization coil, said first magnetization coil including two input terminals for coupling a control signal into the windings of said first magnetization coil; and a primary coil formed around said closed-loop core in such a way that the primary coil exhibits a variable inductance the value of which is controlled by the control signal changing the magnetic permeability of the closed-loop core, said primary coil comprising one or more loops, each of which is arranged about said core so that said magnetization coil produces a net magnetization flux through each of said one or more loops that is substantially zero, said primary coil having input terminals for receiving the high-frequency current signal.

20. The inductance element of claim 19 further comprising a second magnetization coil wound around said core so as to pass through said central opening whereby said core forms a closed magnetic flux path for said second magnetization coil, said second magnetization coil including two input terminals for coupling the control signal into the windings of said second magnetization coil.

21. The inductance element of claim 20 further comprising a control circuit connected to the input terminals of said first and second magnetization coils, wherein in operation said control circuit supplies a control current to said first and second magnetization coils so as to modulate the permeability of the core and thereby modulate the inductive reactance as seen by the high-frequency current signal.

22. The inductance element of claim 20 wherein the first magnetization coil has a first axis, the second magnetization coil has a second axis, and the primary coil has a primary axis and wherein the first and second axes are substantially perpendicular to said primary axis of the primary coil.

23. The inductance element of claim 19 wherein the closed-loop core is rectangularly shaped and has two long sections and two short sections and wherein the two long sections are joined at each end by a corresponding one of the two short sections, wherein the two long sections of said core are parallel to each other and the two short sections of said core are parallel to each other, and wherein the primary coil is formed around said two long sections.

24. The inductance element of claim 23 wherein each of the two magnetization coils is wound around a corresponding different one of the two short sections of said core.

25. The inductance element of claim 24 wherein said core is made of a ferromagnetic material.

26. The inductance element of claim 25 wherein said core is made of a ferrite material.

27. The inductance element of claim 24 further comprising a hollow, cylindrically-shaped sleeve around which the primary coil is wound, and wherein said closed loop core is located within said sleeve.

28. The inductance element of claim 27 wherein said hollow, cylindrically-shaped sleeve has a first opening at one end and a second opening at the other end and wherein the first magnetization coil is within said first opening and said second magnetization coil is within said second opening.

29. The inductance element of claim 19 wherein the first magnetization coil has a first axis, the second magnetization coil has a second axis, and the primary coil has a primary axis and wherein the first and second magnetization coils are assembled onto the closed-loop core so that the first and second axes are substantially parallel to the primary axis of the primary coil.

30. The inductance element of claim 23 wherein each of the two magnetization coils is wound around a corresponding different one of the two long sections of said core.

31. The inductance element of claim 30 wherein the two magnetization coils are connected so as to generate cooperating magnetic fields within said closed-loop core.

32. The inductance element of claim 31 wherein said core is made of a ferromagnetic material.

33. The inductance element of claim 32 wherein said core is made of a ferrite material.

34. The inductance element of claim 19 wherein said closed loop lies parallel to a core plane and wherein the primary coil is wound about a primary axis that is substantially parallel to the core plane.

35. An inductance element for generating an electrically tunable inductive reactance to a high-frequency current signal, said inductance element comprising:

a core made of a material which exhibits a non-linear relationship between magnetic field intensity, H, and magnetic flux density, B, said core configured as a closed loop defining a central opening;

a first magnetization coil on said core, said magnetization coil wound around said core so as to pass through said central opening whereby said core forms a closed magnetic flux path for said magnetization coil, said first magnetization coil including two input terminals for coupling a control signal into the windings of said first magnetization coil;

a second magnetization coil wound around said core so as to pass through said central opening whereby said core forms a closed magnetic flux path for said second magnetization coil, second magnetization coil including two input terminals for coupling the control signal into the windings of said second magnetization coil; and a primary coil formed around the outside of said closed-loop core in such a way that the primary coil exhibits a variable inductance the value of which is controlled by the control signal changing the magnetic permeability of the closed-loop core, said primary coil having input terminals for receiving the high-frequency current signal, and wherein the first magnetization coil has a first axis, the second magnetization coil has a second axis, and the primary coil has a primary axis and wherein the first and second axes are substantially perpendicular to said primary axis of the primary coil.

36. The inductance element of claim 35 wherein the closed-loop core is rectangularly shaped and has two long sections and two short sections and wherein the two long sections are joined at each end by a corresponding one of the two short sections, wherein the two long sections of said core are parallel to each other and the two short sections of said core are parallel to each other, and wherein the primary coil is formed around said two long sections.

37. The inductance element of claim 36 wherein each of the two magnetization coils is wound around a corresponding different one of the two short sections of said core.

38. The inductance element of claim 37 wherein said core is made of a ferromagnetic material.

39. The inductance element of claim 38 wherein said core is made of a ferrite material.

40. The inductance element of claim 37 further comprising a hollow, cylindrically-shaped sleeve around which the primary coil is wound, and wherein said closed loop core is located within said sleeve.

41. The inductance element of claim 40 wherein said hollow, cylindrically-shaped sleeve has a first opening at one end and a second opening at the other end and wherein the first magnetization coil is within said first opening and said second magnetization coil is within said second opening.

42. The inductance element of claim 36 wherein each of the two magnetization coils is wound around a corresponding different one of the two long sections of said core.

43. The inductance element of claim 42 wherein the two magnetization coils are connected so as to generate cooperating magnetic fields within said closed-loop core.

44. The inductance element of claim 43 wherein said core is made of a ferromagnetic material.

45. The inductance element of claim 43 wherein said core is made of a ferrite material.

* * * * *